United States Patent
Titus et al.

(10) Patent No.: US 7,038,527 B2
(45) Date of Patent: May 2, 2006

(54) MOS VARACTOR FOR LC VCOS

(75) Inventors: Ward S. Titus, Princeton, NJ (US); John G. Kenney, Jr., West Winsor, NJ (US)

(73) Assignee: Analog Devices, Inc., Norwood, MA (US)

( * ) Notice: Subject to any disclaimer, the term of this patent is extended or adjusted under 35 U.S.C. 154(b) by 120 days.

(21) Appl. No.: 10/786,247

(22) Filed: Feb. 25, 2004

(65) Prior Publication Data

US 2005/0184314 A1    Aug. 25, 2005

(51) Int. Cl.
*H03K 3/01* (2006.01)

(52) U.S. Cl. ............... 327/534; 327/537; 327/586

(58) Field of Classification Search ........... 327/534, 327/535, 537, 586; 331/36 C, 116 FE, 117 FE, 331/117 R, 177 V
See application file for complete search history.

(56) References Cited

U.S. PATENT DOCUMENTS

| | | | |
|---|---|---|---|
| 6,100,770 A * | 8/2000 | Litwin et al. .......... 331/117 FE |
| 6,281,758 B1 * | 8/2001 | Elsayed et al. ............ 331/16 |
| 6,407,412 B1 | 6/2002 | Iniewski et al. ............ 257/107 |
| 6,628,175 B1 * | 9/2003 | Guo et al. ................. 331/158 |
| 6,855,995 B1 * | 2/2005 | Altmann ................... 257/401 |
| 2003/0141936 A1 * | 7/2003 | Staszewski et al. ........... 331/16 |
| 2004/0263272 A1 * | 12/2004 | Ravi et al. .............. 331/177 V |

OTHER PUBLICATIONS

Andreani, P., et al "On the Use of MOS Varactors in RF VCO's", *IEEE Journal of Solid-State Circuits*, vol. 35, No. 6, Jun. 2000, pp. 905910.

Bunch, R. L, et al "Large-Signal Analysis of MOS Varactors in CMOS-G LC VCOs", *IEEE Journal of Solid-State Circuits*, vol. 38, No. 8, Aug. 2003, pp. 1325-1332.

Maget, J., et al "Influence of Novel MOS Varactors on the Performance of a Fully Integrated UMTS VCO in Standard 0.25-μm CMOS Technology", *IEEE Journal of Solid-State Circuits*, vol. 37, No. 7, Jul. 2002, pp. 953-958.

Typpo, J. "A Back Gate Tunned PFET VCO", *Analog Integrated Circuits and Signal Processing*, 30, 265-269, 2002.

* cited by examiner

*Primary Examiner*—Kenneth B. Wells
(74) *Attorney, Agent, or Firm*—Bromberg & Sunstein LLP

(57) ABSTRACT

A metal oxide semiconductor (MOS) varactor device has a source and a drain connected to each other, and a back gate, electrically separate from the source and drain, which is connected to a circuit common mode point.

12 Claims, 21 Drawing Sheets

Calculate small swing tuning range, varactor Q, C(V) for D=S BG NMOS
36.00Wx2.00L, 4s, 1 NMOS varactor, ideal 0.36nH inductor tank
Process: nominal Temp: 25.0 deg C
Min Vtune: -2.00V Fc: 9.169 GHz VarQ: 163.8 Ztank: 3358.68 Ohms - 116 MHz/V
Max Vtune: 0.45V Fc: 10.637 GHz VarQ: 758.6 Ztank: 18138.23 Ohms 351 Mhz/V
Tuning Range: 1468.63 MHz 14.83 % about Favg: 9.903 GHz GainRatio: -0.3:1

Calculate small swing tuning range, varactor Q, C(V) for D=S BG=GND, I- NMOS 36.00Wx2. 00L, 4s, 1 NMOS varactor, ideal 0.36nH inductor tank
Process: nominal Temp: 25.0 deg C
Min Vtune: 1.80V Fc: 9.211 GHz VarQ: 165.0 Ztank: 3400.90 Ohms  34 MHz/V
Max Vtune: -2.00V Fc: 11.124 GHz VarQ: 1006.6 Ztank: 25247.86 Ohms 2 Mhz/V
Tuning Range: 1912.92 MHz 18.81 % about Favg: 10.167 GHz  GainRatio: 16.2:1

MOS VARACTOR FOR LC VCOS

FIELD OF THE INVENTION

The invention generally relates to voltage controlled oscillators for radio frequency circuits, and specifically to an MOS varactor for such circuits.

BACKGROUND ART

Implementing monolithic voltage controlled oscillators (VCOs) in standard complementary metal oxide semiconductor (CMOS) technology is a major challenge for the design of radio-frequency (RF) CMOS transceiver integrated circuits (ICs). Recent work has shown that MOS devices for voltage control can produce better VCO performance than commonly used diode varactors. These advantages include better tuning range, better Q, and so better VCO phase noise. Both nMOS and pMOS variety devices can be used as varactors, typically with source and drain terminals shorted (S=D), and a tuning voltage applied to the gate terminal with respect to the source and drain.

Several modes of MOS varactor operation are known depending on the connection of the fourth device terminal, the transistor back gate (BG). For standard bulk p-type substrate CMOS technology, only pMOS devices can be used since the back gate BG of nMOS devices are tied to a grounded substrate. New triple well CMOS technologies, now common in 0.18 and 0.13 μm gate lengths, offer a triple well option that extends the flexibility of BG terminal connection for an nMOS device. nMOS devices have advantages over pMOS devices as varactors in terms of better Q and better capacitance range.

When used in a VCO, MOS varactors typically operate under large signal tank swings necessary for good phase noise and moderate gain constant (Kvco) or tuning gain (Hz/V). These large signals, typically 1 to 8 volts peak-to-peak over a back to back, series connected, pair of varactors, are well known to linearize the sharp capacitance variation with a tuning voltage (C(V)) which typically varies from Cmin to Cmax in a few hundred mV under small signal conditions.

Three MOS varactor modes of operation are recognized. In the first mode (Mode 1), the pMOS BG is tied to the drain supply voltage $V_{DD}$, or the nMOS substrate is grounded, or a triple well nMOS BG is tied to ground. This mode (S=D, BG=GND as nMOS) has superior C(V) range, using the inversion MOS bias region of operation only. For this reason, it is called I-MOS for inversion MOS. One disadvantage of this mode with supply referenced VCO tanks and/or tuning voltages is a sensitivity to supply noise and supply variations (frequency pushing). This deficiency often requires a remedy of additional supply regulation and/or large off-chip capacitor filtering that are undesirable for low power and low cost communication applications.

The second MOS varactor mode (Mode 2) ties the pMOS or triple well nMOS back gate BG to the source and drain. This mode (S=D=BG) has a reduced C(V) range, and uses both inversion and accumulation MOS bias regions of operation. It is not sensitive to supply noise or frequency pushing because its BG is isolated from both supply and ground. But, under typical large signal VCO swing operation it has less than half the tuning range, which makes it less advantageous to use.

Standard CMOS technologies have process and temperature variations that must be tuned out by the VCO. Also, many communication applications (such as Sonet OC-192) have multiple rates or frequencies that must be tuned to (9.954, 10.66, 11.1 GHz for OC-192). Both requirements make a large VCO tuning range or large varactor C(V) range important. Even for implementations that use other methods for tuning to rate or tuning out process variations (for example, multiple switched VCOs and discreet tuning methods such as switched capacitors or inductors), frequency variations from temperature effects alone still make a large varactor C(V) range important because these alternative tuning methods present their own capacitance load to the VCO tank, there by decoupling or attenuating the C(V) effect of the varactor alone.

The third MOS varactor mode (Mode 3) is an accumulation-only device called an A-MOS device. It is formed by removing source and drain diffusions (p+ type for a pMOS device), and perhaps adding bulk contacts (n+ type for what was a pMOS device). The resulting device has a floating BG and is not strictly a MOS transistor device. The A-MOS floating BG makes it insensitive to supply noise/pushing in a VCO application. While the A-MOS C(V) range is typically as large as an I-MOS even under large signal operation, it suffers from the disadvantage of not being a commonly used, well-modeled CMOS device structure such as the standard nMOS or pMOS devices. As a result, the A-MOS device often is not well-controlled, reliably fabricated, or accurately modeled.

SUMMARY OF THE INVENTION

Embodiments of the present invention are directed to a varactor for CMOS technologies that has the advantages the I-MOS device, a large C(V) range, good Q, well-modeled and controlled in a standard process, but doesn't have its disadvantages, such as poor supply pushing and supply noise isolation.

Specific embodiments include a metal oxide semiconductor (MOS) varactor device having a source and a drain connected to each other, and a back gate, electrically separate from the source and drain, which is connected to a circuit common mode point. The common mode point may be referenced to a circuit supply voltage. The device may be part of a voltage controlled oscillator (VCO), for example, part of an LC tank circuit. The device may be an nMOS or a pMOS device.

DETAILED DESCRIPTION OF THE SPECIFIC EMBODIMENTS

Figure 1:
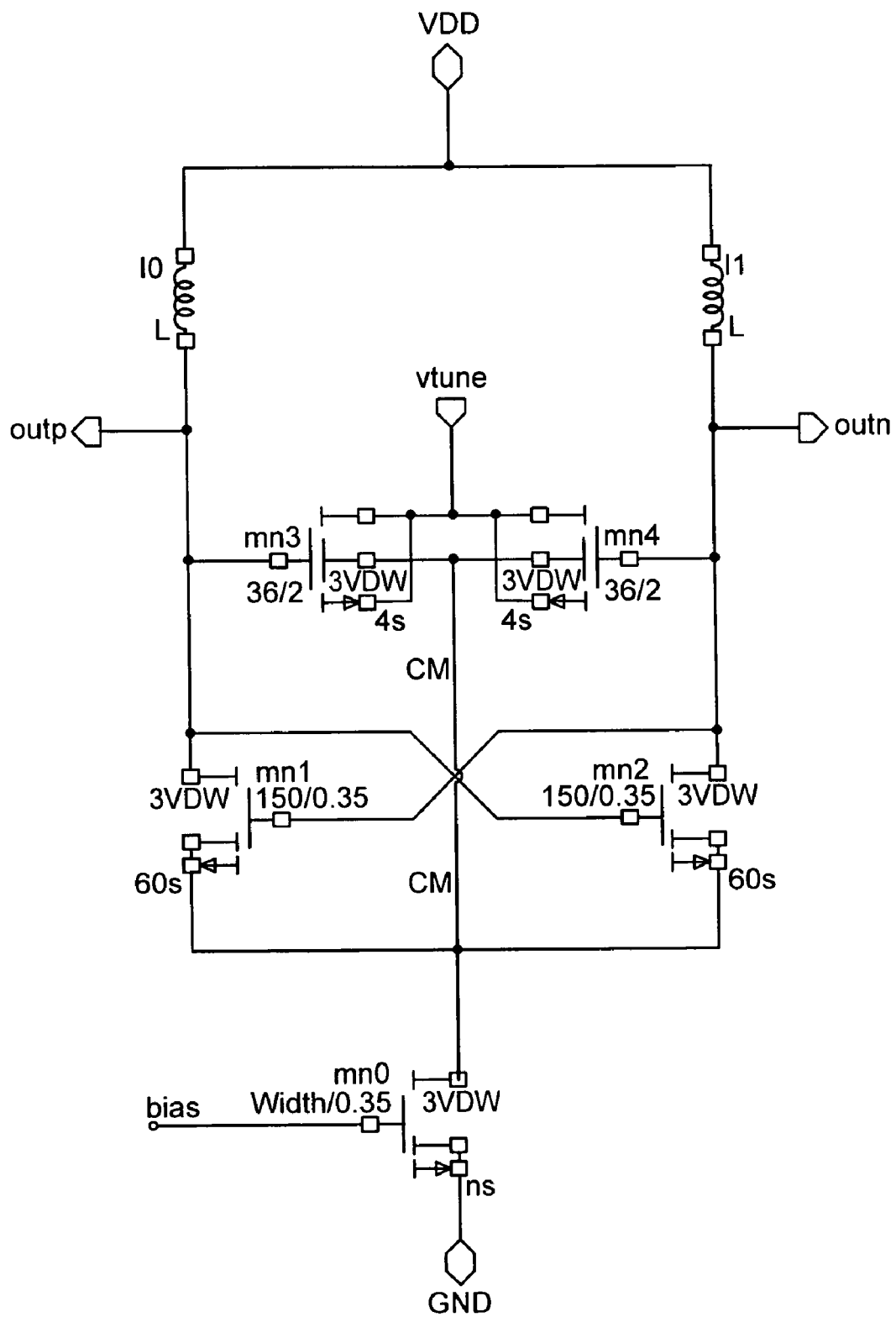
FIG. 1 shows an nMOS VCO with nMOS varactor having BG connected to a common mode point according to an embodiment of the present invention.

An improved MOS varactor for LC-tank VCO applications is formed by connecting the MOS varactor fourth terminal BG to a ground-isolated common mode point of the negative transconductance (Gm) devices used to pump the VCO tank, as shown in FIG. 1, which shows a $V_{DD}$-referred tank, nMOS negative Gm device, cross-coupled differential VCO in a triple well CMOS process. This new varactor mode is referred to as the fourth mode (Mode 4). Since the tuning voltage and the common mode point are both $V_{DD}$-referred, supply noise is not coupled into the tank by the varactor back gate capacitance and the VCO has excellent supply pushing (5 MHz/V simulated for this 10 GHz VCO example, or 90 ppm for a +/−5% 1.8V supply variation). For this example, the common mode point is held constant, at a $V_{gs}$ from MN1, MN2 below $V_{DD}$ by the current source, MN0. (An automatic leveling control is used to adjust the current in the current source, MN0, to maintain a constant large signal tank swing across nMOS varactors, MN3 and MN4, thereby producing a constant common mode point from a constant current into a constant tank resonate impedance.)

Figure 2:
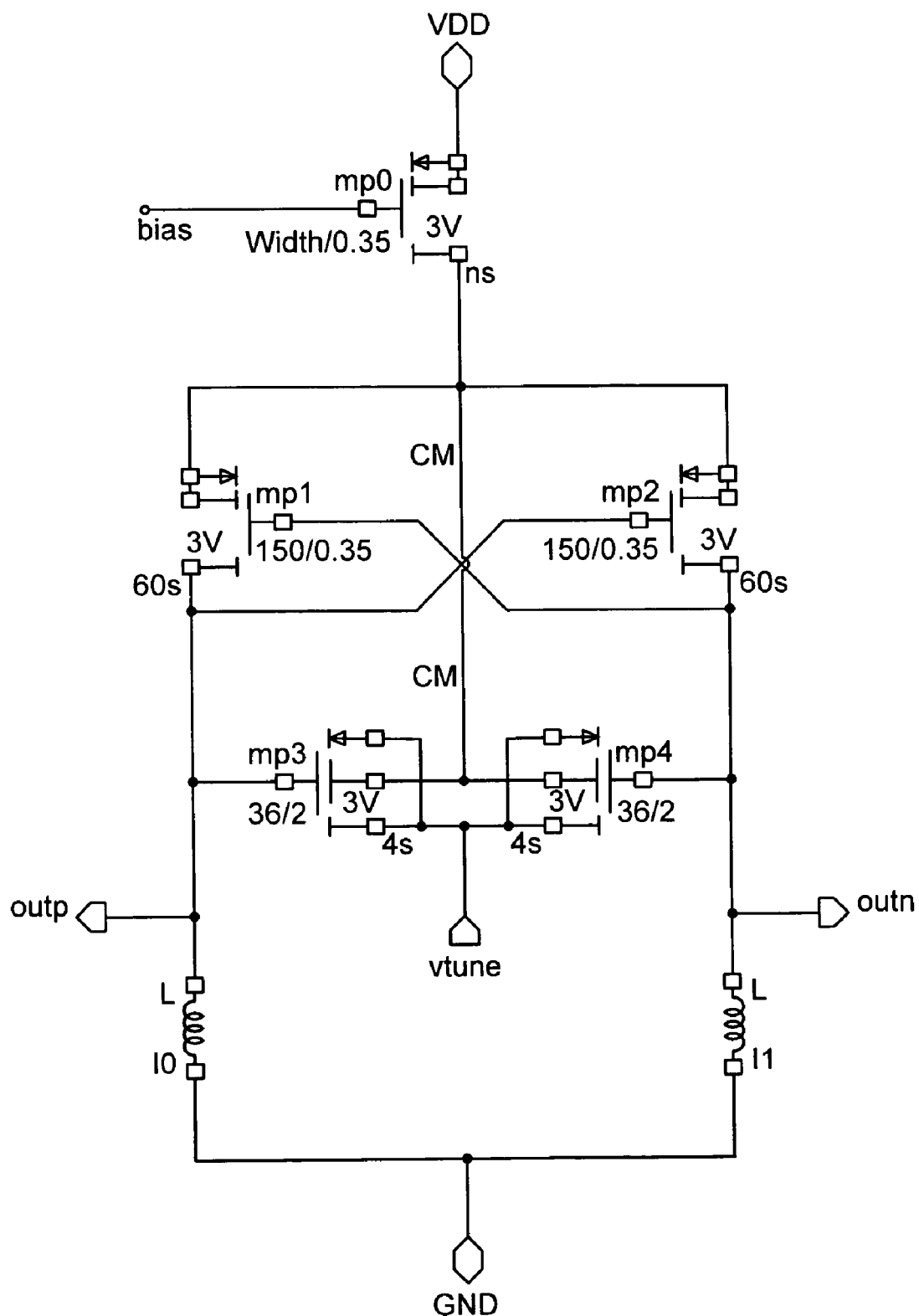
FIG. 2 shows a pMOS VCO with pMOS varactor having BG connected to a common mode point.

Embodiments are also applicable to pMOS varactors and ground referenced tanks. Such applications basically flip the circuit as shown in FIG. 2, replacing nMOS with pMOS devices.

Figure 3:
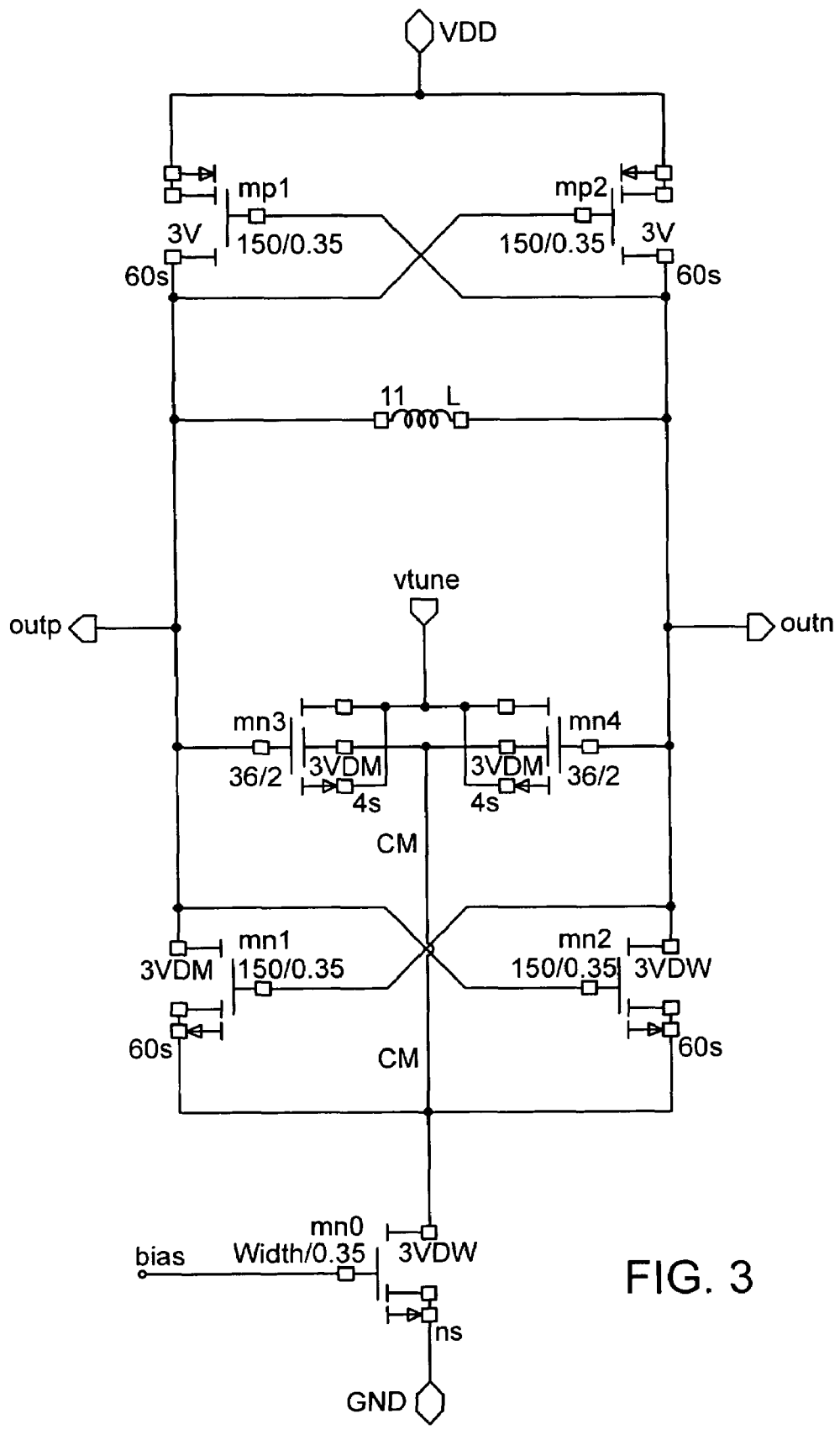
FIG. 3 shows a CMOS VCO with nMOS varactor having BG connected to a common mode point according to an embodiment of the present invention.

Embodiments also include a complementary CMOS VCO that has both nMOS and pMOS cross-coupled negative Gm devices pumping the LC tank shown in FIG. 3. The tuning voltage is $V_{DD}$-referred by the gate-source voltage $V_{gs}$ of the pMOS negative Gm devices, MP1 and MP2. The common mode point also is $V_{DD}$-referred by the $V_{gs}$ of the same pMOS devices, MP1 and MP2, in series with the $V_{gs}$ of the nMOS negative Gm devices, MN1 and MN2. Since the tuning voltage and common mode point are both $V_{DD}$-referred, supply noise is not coupled into the LC tank by the varactor BG capacitance, and the VCO has excellent supply pushing.

Figure 4:
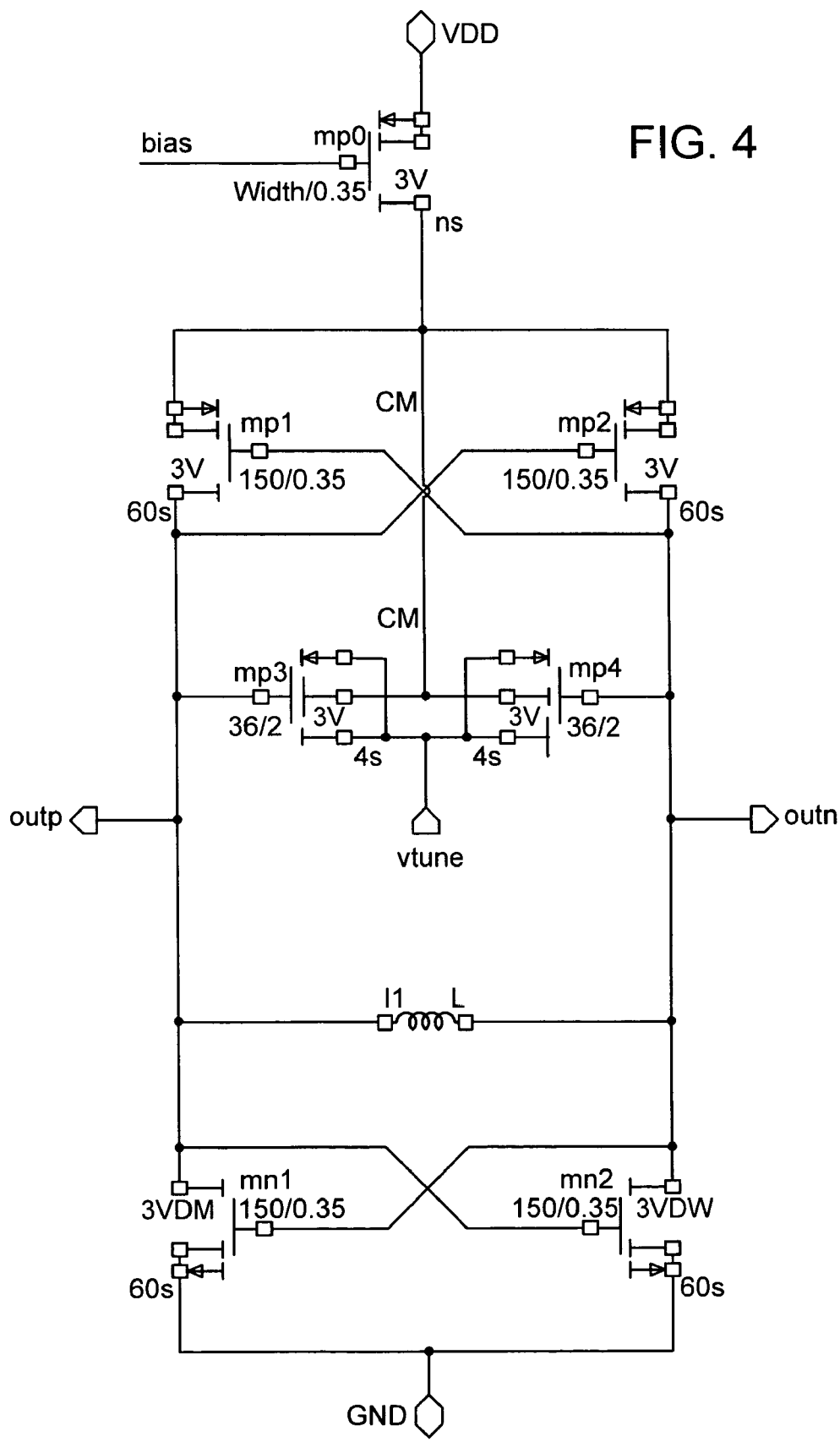
FIG. 4 shows a CMOS VCO with pMOS varactor having BG connected to a common mode point.

Embodiments also include a ground-referenced CMOS VCO that has a pMOS current source and pMOS varactors as shown in FIG. 4.

Figure 5:
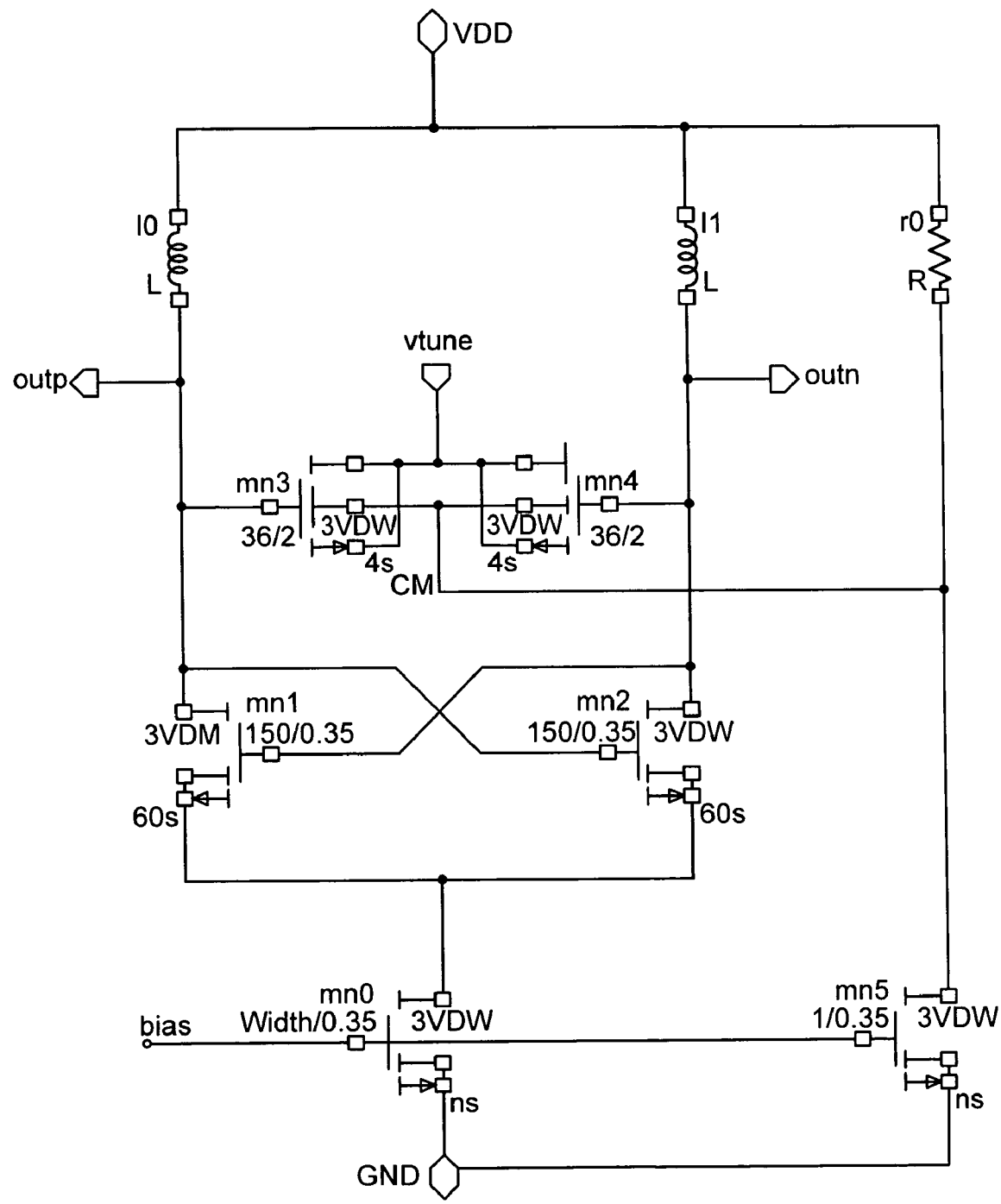
FIG. 5 shows an nMOS VCO with nMOS varactor having BG connected to an alternative common mode point.

The common mode point located beneath a cross-coupled negative Gm pair and above a current source, provides a convenient connection to the varactor BG that enhances the performance of the varactor in this type of VCO by eliminating supply pushing and supply noise coupling to the tank while still obtaining nearly the full C(V) inversion mode range from the varactor. One such convenience is that the node already exists in the differential circuit. However, it is also possible to implement embodiments of the invention by creating a separate common mode node as shown in FIG. 5, where a mirrored current is dropped across a resistor from current source MN5 to $V_{DD}$, creating an alternative common mode point to connect an nMOS varactor BG. The voltage need not be dropped across a resistor, but some other device such as a diode or diode-connected MOS device, for example, can be used instead. Such an embodiment possesses beneficial supply noise, pushing suppression and full C(V) inversion mode range such as in an inherent common mode node. It is also possible for such embodiments to take the forms illustrated in the pMOS and CMOS versions with the inherent common node.

MOS Varactor Modes and Simulations

Figure 6:
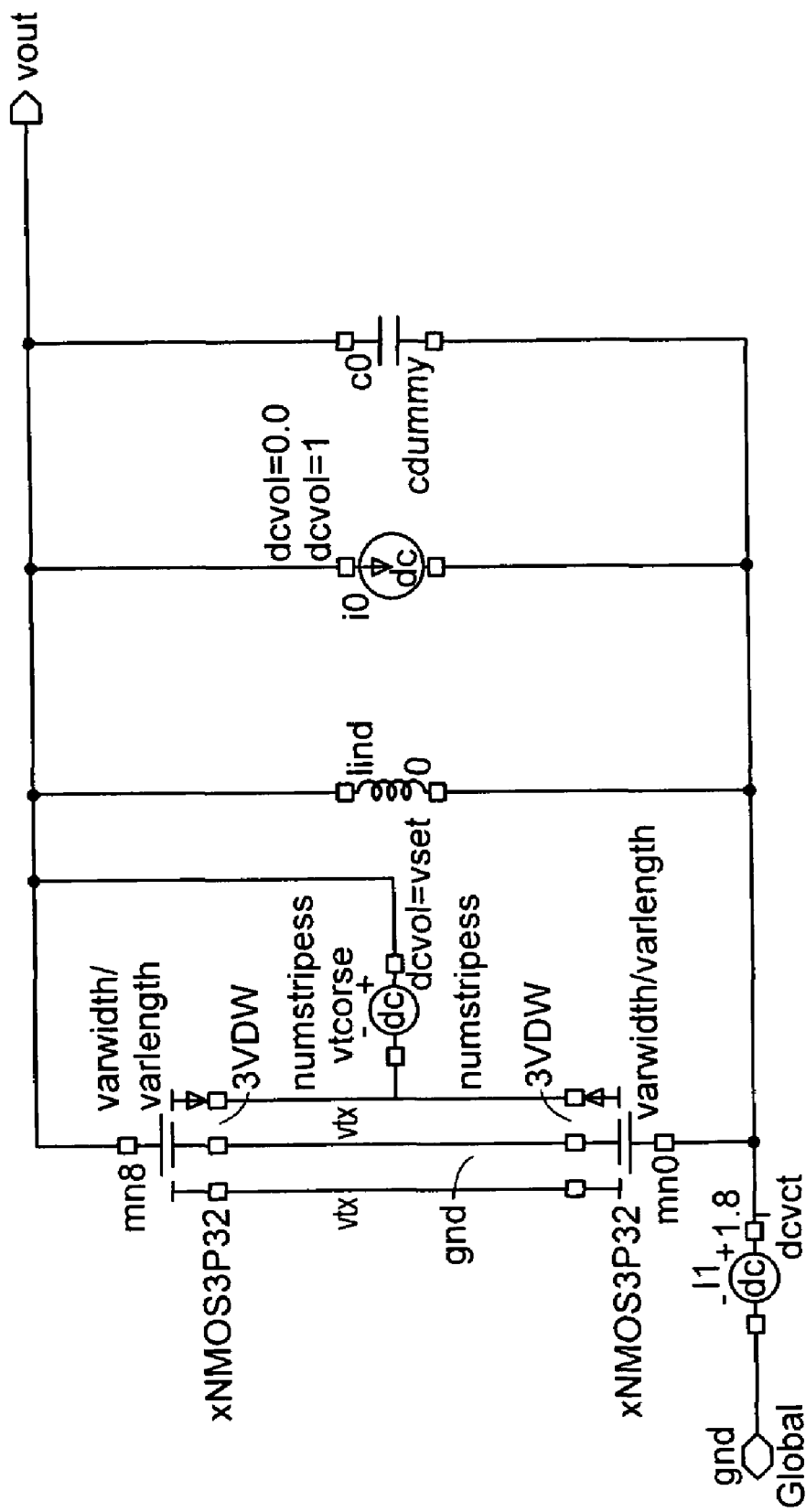
FIG. 6 shows a Mode 1 nMOS varactor resonant tank circuit with BG tied to ground.

Simulations of the small signal performance of the various MOS varactor modes can provide further insight. The BG of the nMOS varactors in FIG. 6 is connected to ground as an inversion mode (I-MOS) MOS varactor in a simulation of a $V_{DD}$-referenced tank with dual nMOS varactors (MN0 and MN8), ideal inductor (L0), and an ideal capacitor (C0). Varactor sizes, capacitance (C0=500 fF) and inductance (L0=0.36 nH) values are chosen for a convenient resonance near 10 GHz. The relatively large fixed C0 capacitance also limits the tuning bandwidth of the varactors in a manner to be expected from an actual VCO with additional methods of tuning (such as switched MIMCAPs) and other sources of parasitic capacitance (from spiral inductors, negative GM devices, etc.). In a practical VCO, the tank of FIG. 6 would require a source of energy such as that provided by the negative Gm transistors in a differential cross-coupled VCO.

For the purpose of this simulation, a 1 amp AC current source is applied across the tank, serving to generate an AC voltage at node "vout" that is equal to the tank impedance, $Z_{tank}$. As the frequency of this AC source is swept, a peaked impedance resonance waveform at vout is produced. The peak vout or highest impedance Z occurs at the tank resonant frequency, Fo, the frequency at which a corresponding VCO would oscillate. Tank Q is extracted from the swept waveform as the peak frequency divided by peak width at ½ peak value. Since the circuit has ideal inductance (L) and capacitance (C) components, the tank Q is completely determined by the varactor. A voltage source is applied to node "vtx"=D =S of the nMOS varactor to provide the varactor tuning voltage. By stepping this tuning voltage and sweeping the frequency of an AC simulation at each step, a set of frequency and Q vs tuning voltage and varactor C(V) curves can be constructed. The varactor C(V) is obtained from the BSIM3 MOS model and is-the sum of the gate-source capacitance $C_{gs}$, gate-drain capacitance $C_{gd}$, and gate-back gate capacitance $C_{gb}$ aspects that are generated by a DC simulation at each tuning voltage step.

Mode 1: I-MOS Varactor

Figure 7:
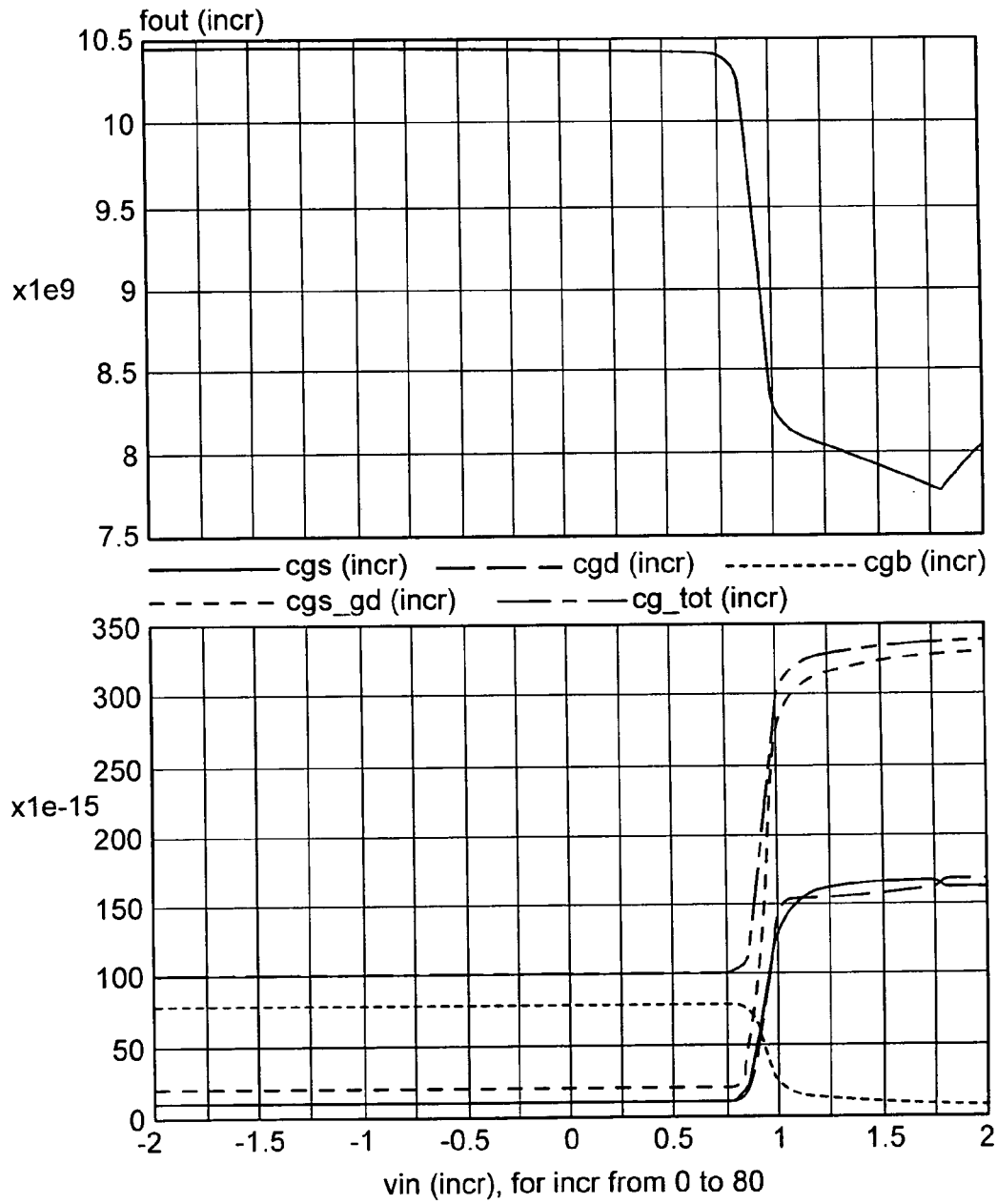
FIG. 7 shows F(V) and C(V) curves for a Mode 1 varactor circuit according to FIG. 6.

FIG. 7 shows the simulated frequency and varactor capacitance vs. tuning voltage (x-axis labeled "vin"). Frequency change is monotonic with tuning voltage, relatively abrupt from 0.8 to 1 V with a total tuning range of 7.76 to 10.45 GHz and a 2690 MHz bandwidth (BW). In the lower half of FIG. 7, $C_{gs}$, $C_{gd}$ and $C_{gb}$ are plotted along with the sum of $C_{gs}$ and $C_{gd}$ (labeled cgs_gd) and the total varactor C(V) (labeled cg_tot). $C_{gs}$ and $C_{gd}$ are approximately equal and are the dominant varying capacitances for the I-MOS mode. $C_{gb}$ rises somewhat as $V_{gs}$ drops below $V_{th}$ and limits the C(V) ratio $C_{max}/C_{min}$ to 3.4 (340 fF/100 fF). The I-MOS Q (curve not shown) varies from 136 to 915. Under large signal operation, the abruptness of the C(V) transition is moderated by a time averaging of the varying capacitance, but the large constant $C_{max}$ (and to some extent $C_{min}$) region preserve a large tuning bandwidth.

Mode 2: D=S=BG Varactor

Figure 8:
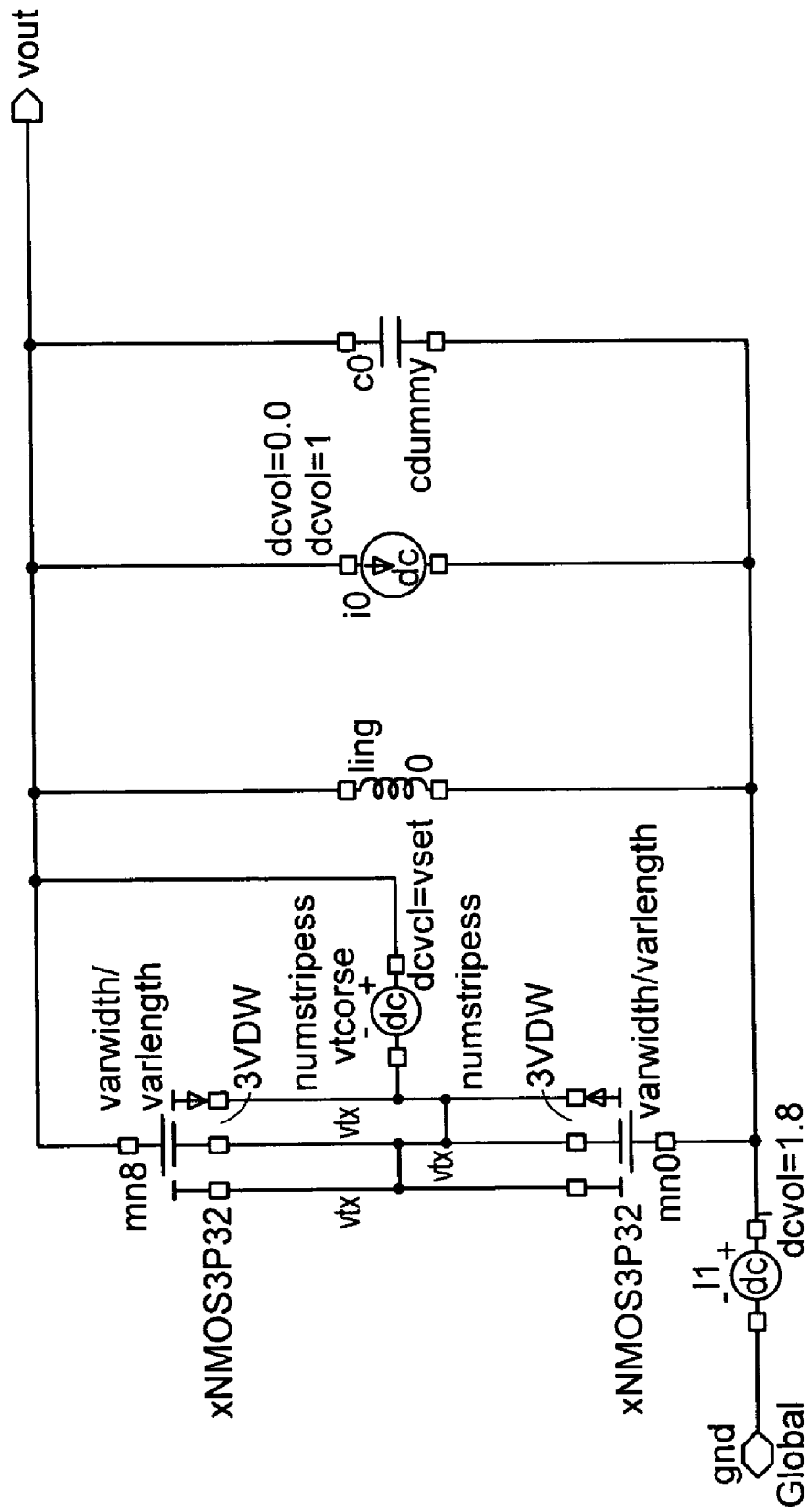
FIG. 8 shows a Mode 2 nMOS varactor resonant tank circuit with BG tied to the source and drain.
Figure 9:
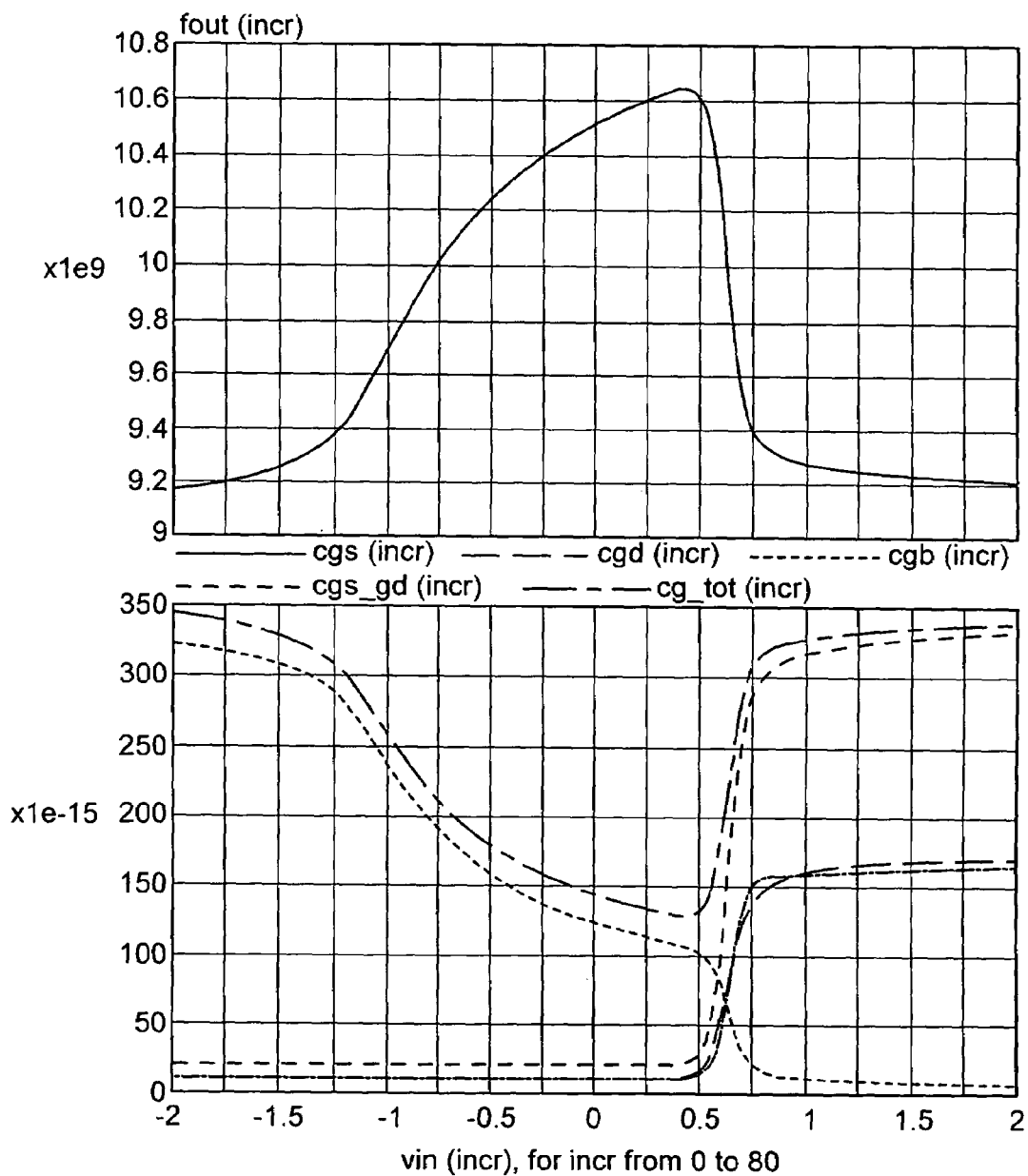
FIG. 9 shows F(V) and C(V) curves for a Mode 2 varactor circuit according to FIG. 8.

FIG. 8 shows an identical LC resonant circuit, except now the nMOS varactor has its back gate BG connected to its source and drain nodes (=S =D). The simulated tuning response of this circuit is shown in FIG. 9. Some differences between this varactor mode and the previous I-MOS are apparent. The S-shaped frequency tuning (F(V)) and C(V) curves of the I-MOS are replaced by U-shaped curves. The frequency change is not monotonic with tuning voltage, but is still abrupt for the inversion operation. An accumulation mode (tuning voltage from −2.0 to +0.45V) is now evident and has approximately the same frequency range, 9.17 to 10.64 GHz, a 1468 MHz BW as the inversion mode, but in comparison to the I-MOS, the D=S=BG varactor has 55% the tuning bandwidth. The C(V) curves show a large rising $C_{bg}$ at negative $V_{gs}$ and a $C_{max}/C_{min}$ ratio of 2.6 (340 fF/130 fF) that is approximately equal in both inversion and accumulation modes. The D=S=BG Q (curve not shown) varies from 82 to 380, less than the I-MOS varactor, but still relatively large compared to typical IC spiral inductor Qs.

A large signal bandwidth and capacitance ratio comparison of the D=S=BG varactor versus the I-MOS varactor produces an additional degradation caused by the non-monotonic behavior of the C(V) in the accumulation region. For example this worsens the large signal tuning bandwidth to about 50% of that available from the I-MOS varactor when a 3V pk-pk tank swing is time averaged over the U-shaped C(V) response of a back to back, series connected, pair of such varactors. The larger the signal, the greater the BW reduction.

Mode 4: D=S, BG=CM Varactor

Figure 10:
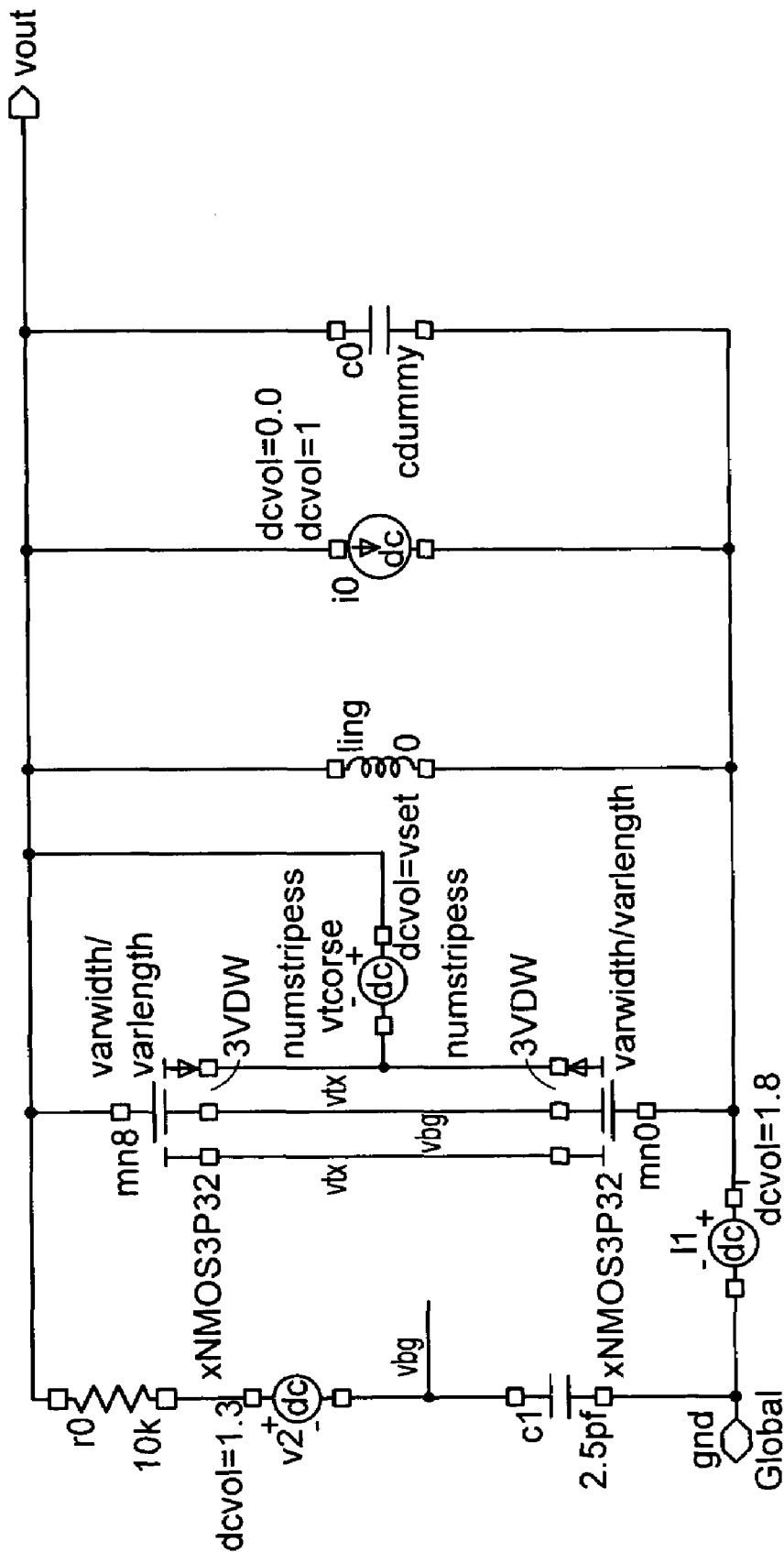
FIG. 10 shows a Mode 4a nMOS varactor resonant tank circuit with BG tied to a $V_{DD}$-referred common mode point voltage according to an embodiment of the present invention.
Figure 11:
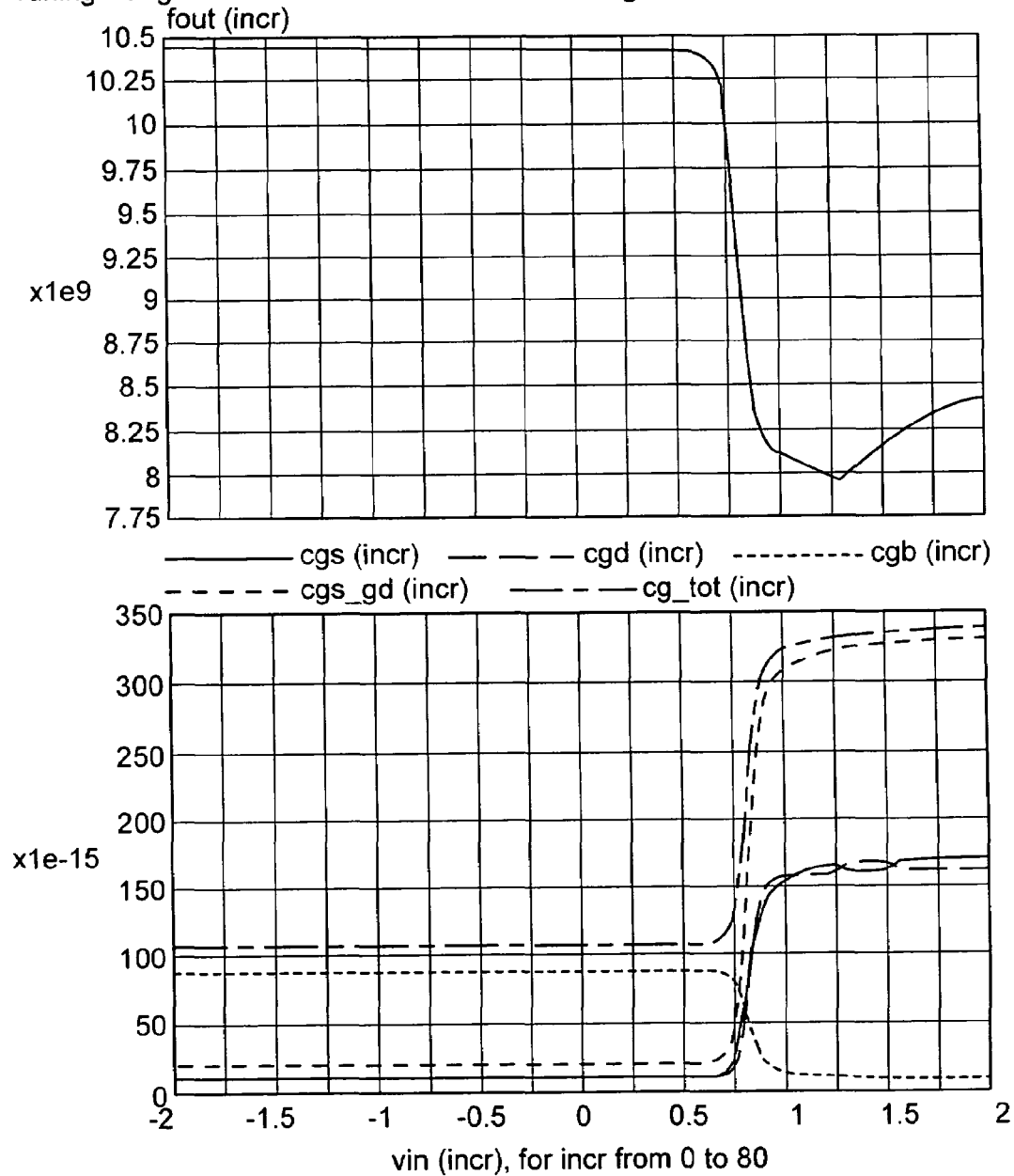
FIG. 11 shows F(V) and C(V) curves for a Mode 4a varactor circuit according to FIG. 10.

FIG. 10 shows another version of the LC resonant circuit, except now the nMOS varactor back gate BG is connected by a voltage source to the $V_{DD}$ node according to one embodiment of the present invention. A 10K resistor in series with this voltage source and a 2.5 pF cap from the common mode CM to circuit ground GND are added as a filter to further improve the tuning range of this mode, but they are not fundamentally required as will be shown. This voltage source represents the voltage drop from $V_{DD}$ resulting from one of the methods used to generate the common mode voltage as previously discussed. For the simulated F(V) and C(V) curves in FIG. 11, this voltage is set to $V_{dd}$-1.3V, leaving 0.5V headroom for the current source when $V_{DD}$ is 1.8V. At first glance, the simulated performance of the BG=CM appears closest to the I-MOS varactor mode, with S-shaped F(V) and C(V) curves. Frequency change is monotonic with tuning voltage from −2.0 to 1.3V, relatively abrupt from 0.7 to 0.9 V with a total tuning range of 7.93 to 10.44 GHz, a 2518 MHz BW. This BW is only marginally less than the I-MOS varactor mode and nearly double that of the D=S=BG mode. As with the I-MOS mode, in this mode $C_{gb}$ rises somewhat as $V_{gs}$ drops below $V_{th}$ and limits the C(V) ratio $C_{max}/C_{min}$ to 3.2 (340 fF/107 fF). The I-MOS Q (curve not shown) varies from 73 to 100 and although limited by the BG bias network is still substantially larger than necessary for realistic IC VCO tanks. Under large signal operation, the abruptness of the C(V) transition is moderated by a time averaging of the varying capacitance, but the large constant $C_{max}$ (and to some extent $C_{min}$) region preserve a large tuning BW to a much greater extent than the U-shaped response of the D=S=BG varactor mode.

Figure 12:
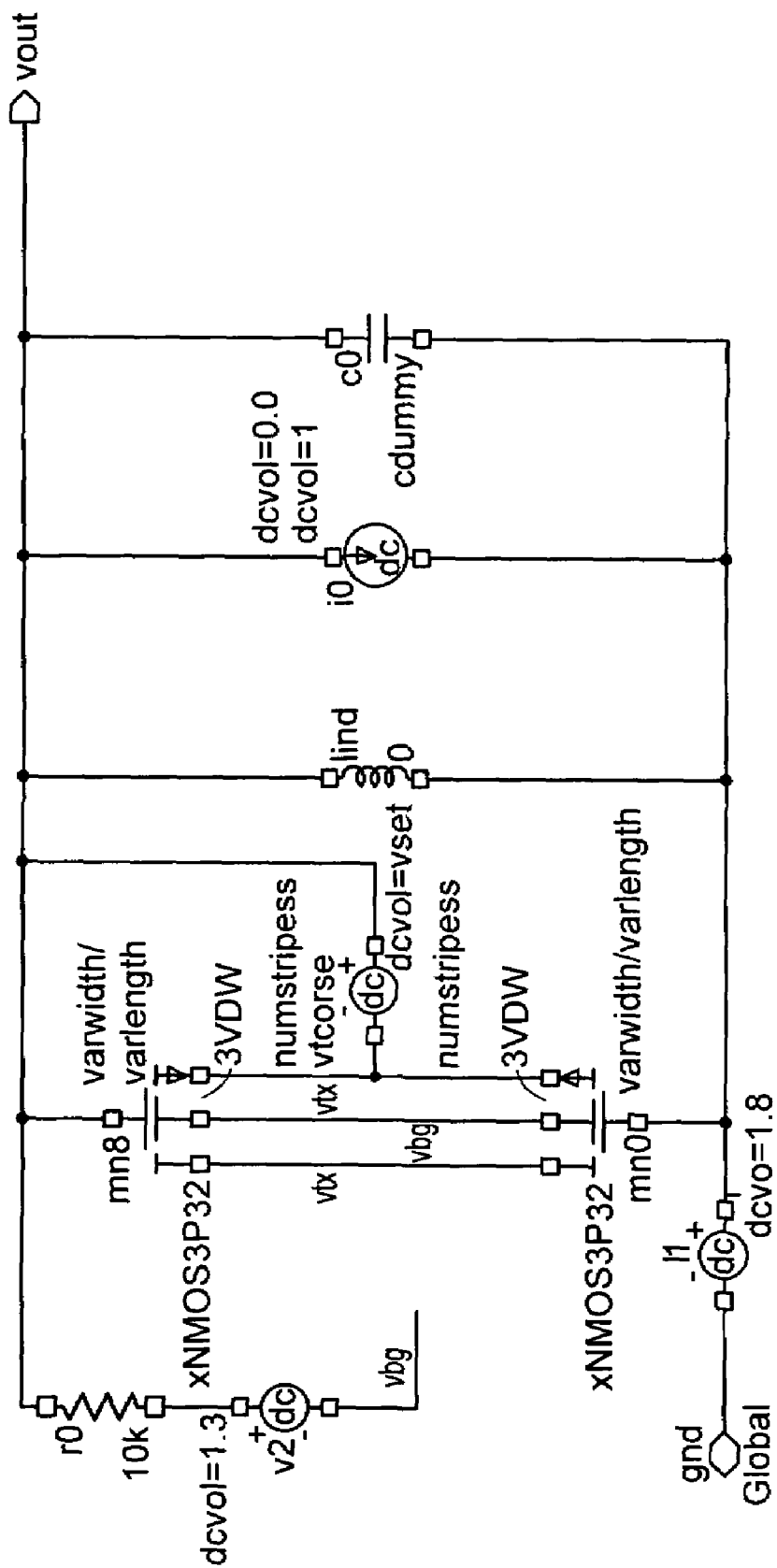
FIG. 12 shows a Mode 4b nMOS varactor resonant tank circuit with BG tied to a $V_{DD}$-referred common mode point voltage according to an embodiment of the present invention.
Figure 13:
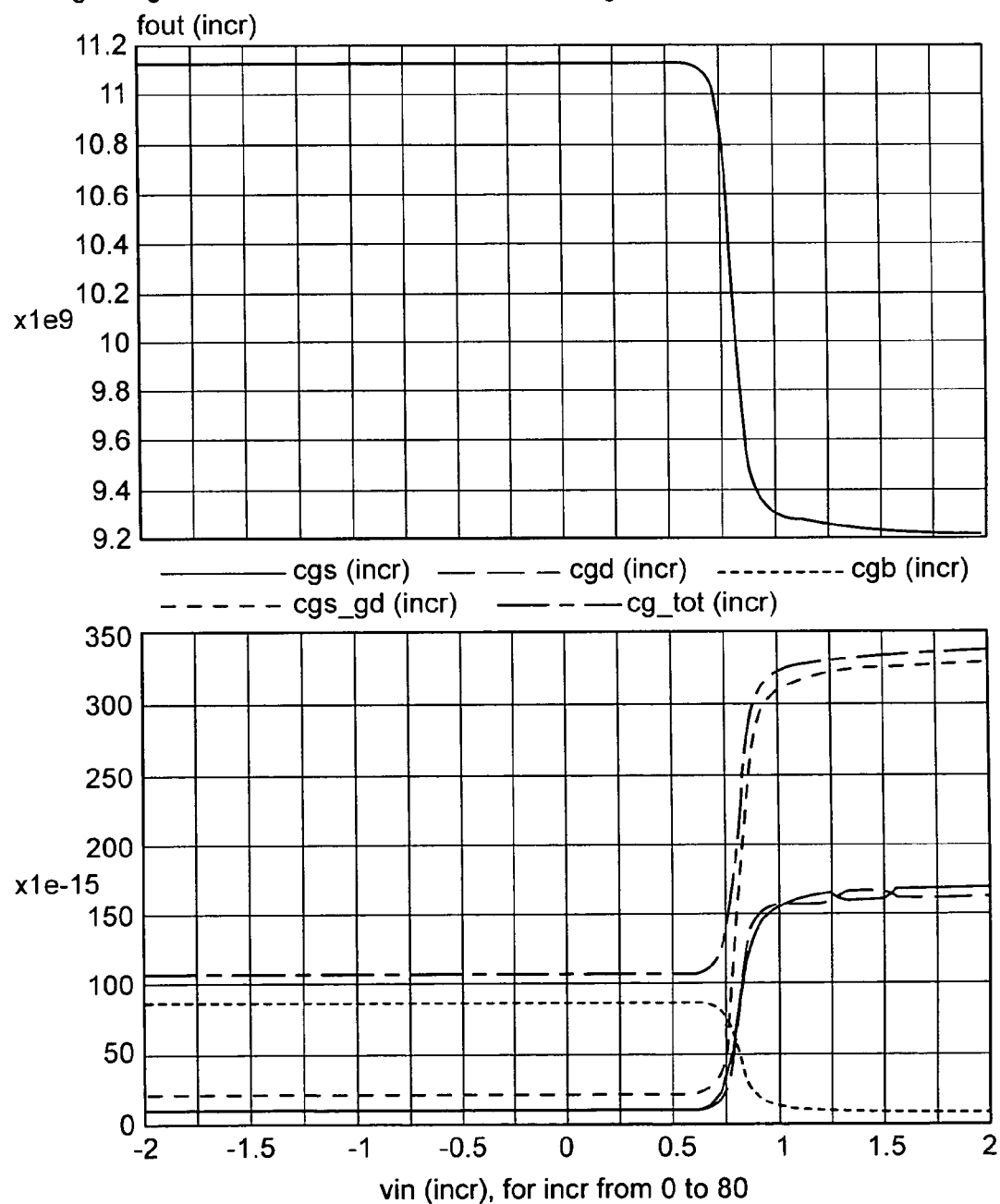
FIG. 13 shows F(V) and C(V) curves for a Mode 4b varactor circuit according to FIG. 12.

The effect of the filter capacitance $C_{filter}$ can be seen in a simulation of an LC resonant circuit shown in FIG. 12 that removes it. As shown in FIG. 13, the F(V) and C(V) curves show an S-shaped characteristic, have less BW than those with $C_{filter}$ (1912 vs 2518 MHz), but 600 MHz higher frequency and larger BW than the U-shaped D=S=BG varactor mode (1912 vs 1469 MHz). The C(V) curves look identical. Under large signal operation, the BW improvement of this mode without $C_{filter}$ will retain more advantage over the D=S=BG mode because of the U-shaped C(V) affects already noted.

VCO Supply Pushing Simulations vs Varactor Mode

Figure 14:
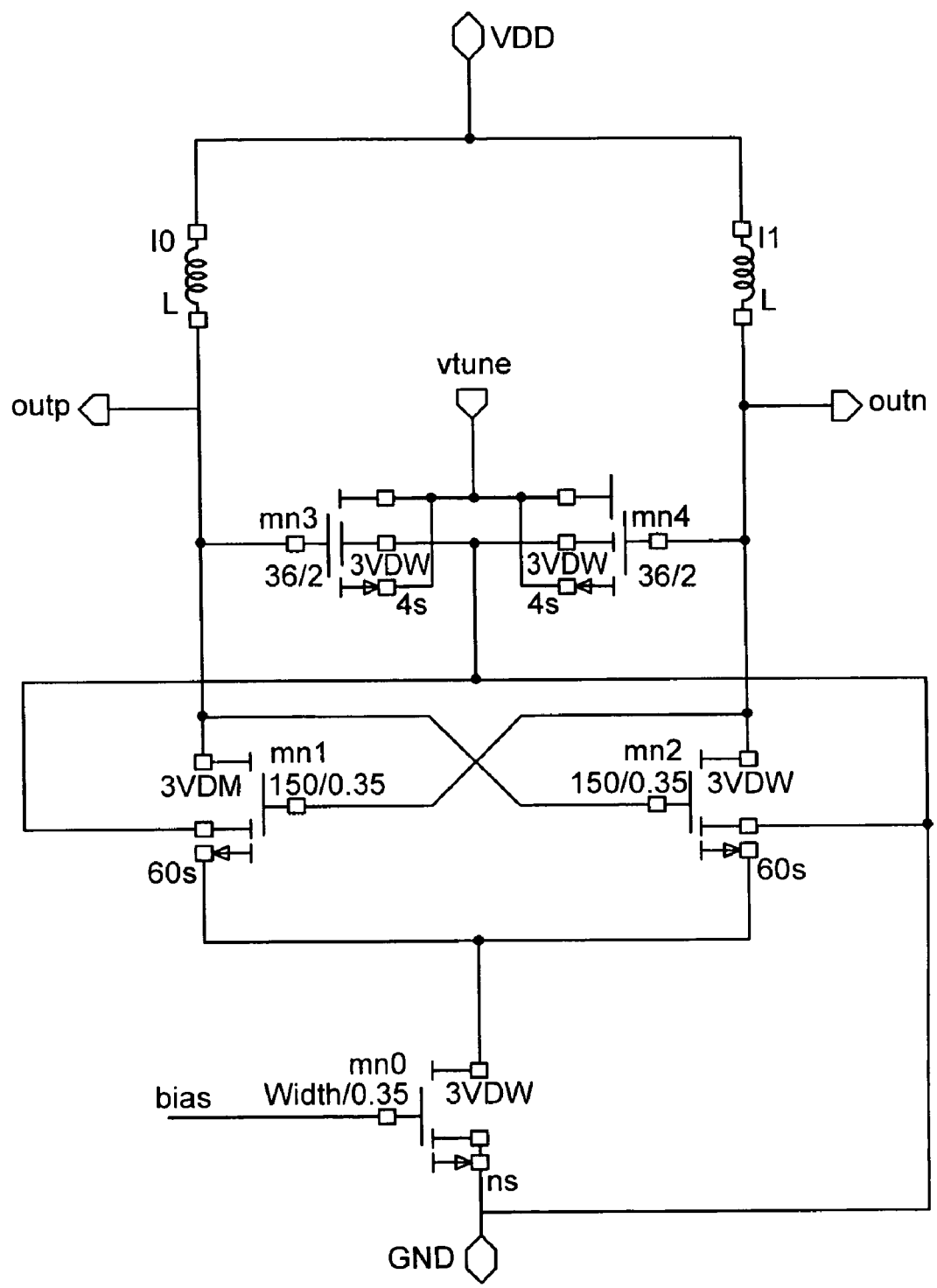
FIG. 14 shows a Mode 1 varactor VCO schematic.
Figure 15:
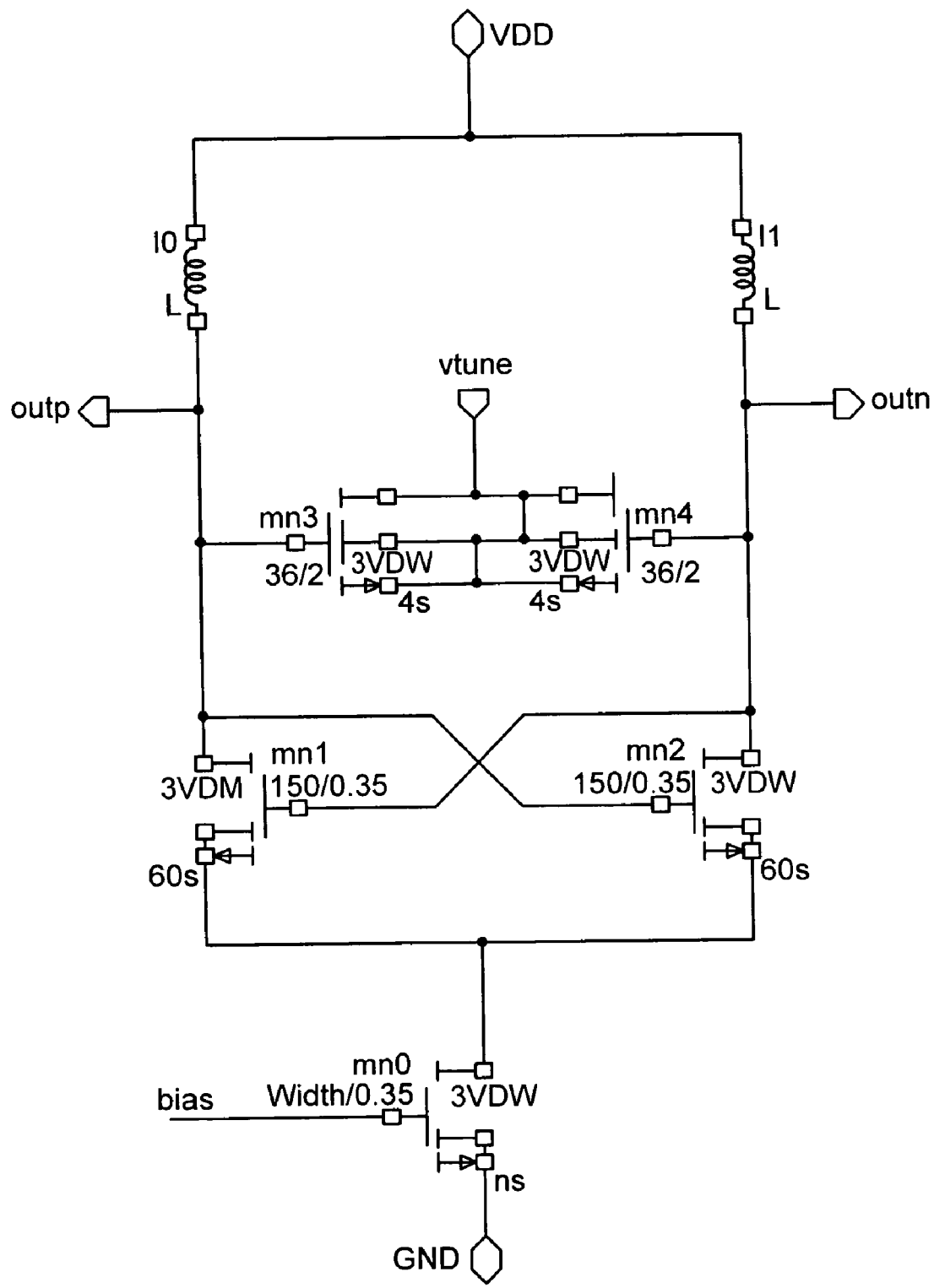
FIG. 15 shows a Mode 2 varactor VCO schematic.
Figure 16:
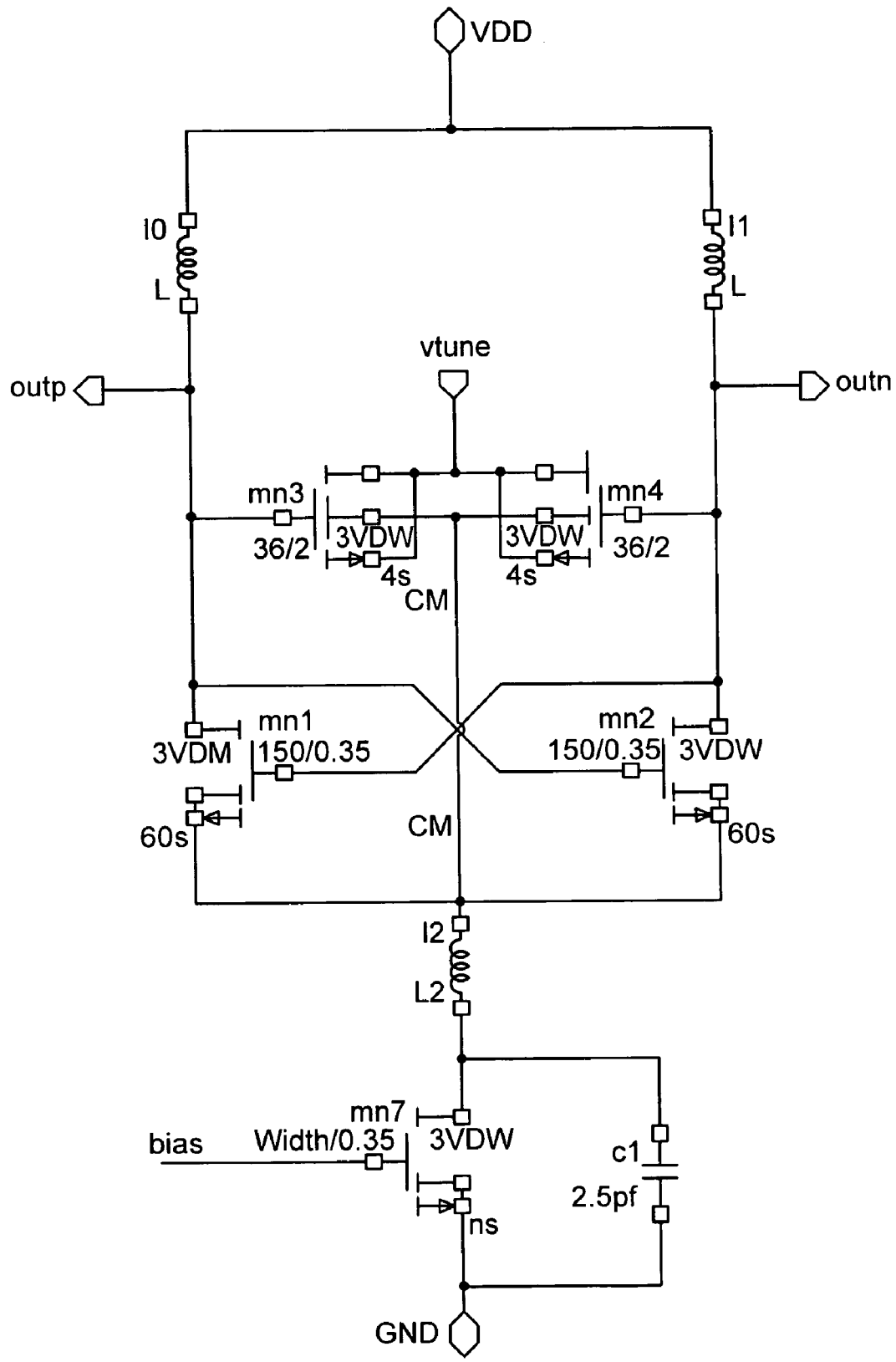
FIG. 16 shows a Mode 4a varactor VCO schematic according to an embodiment of the present invention.
Figure 17:
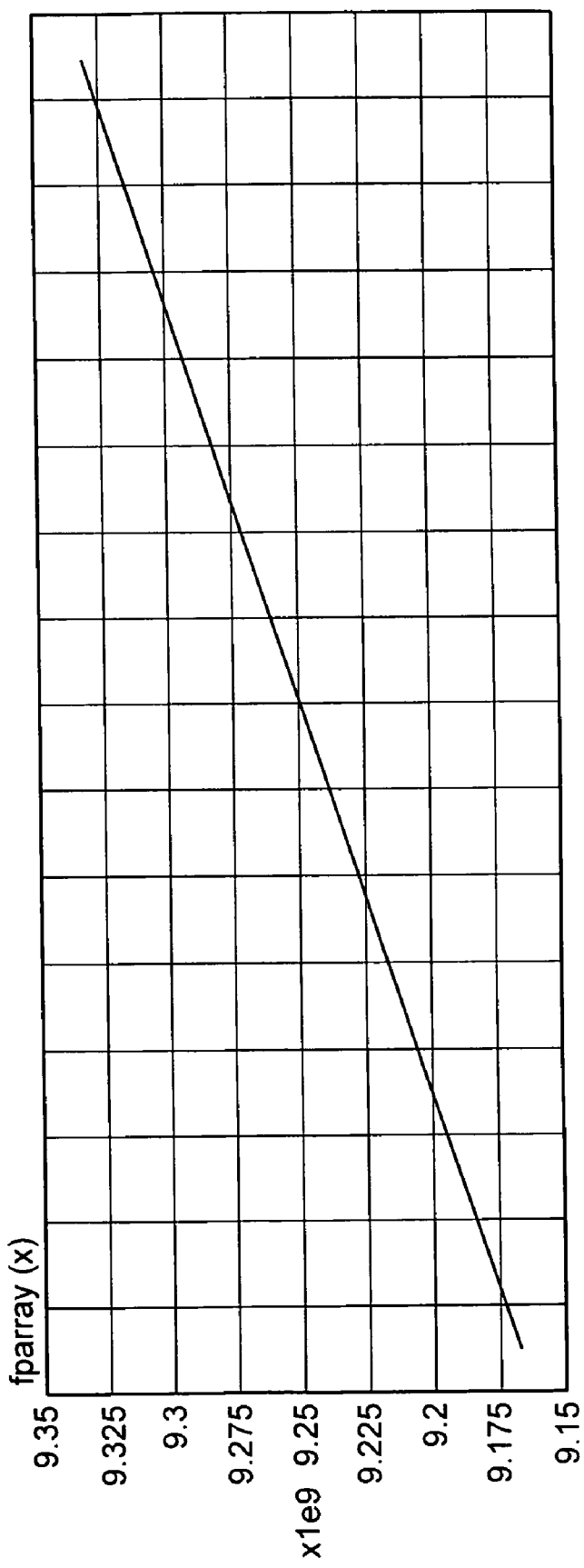
FIG. 17 shows simulated VCO frequency pushing in a Mode 1 varactor VCO according to FIG. 14.
Figure 18:
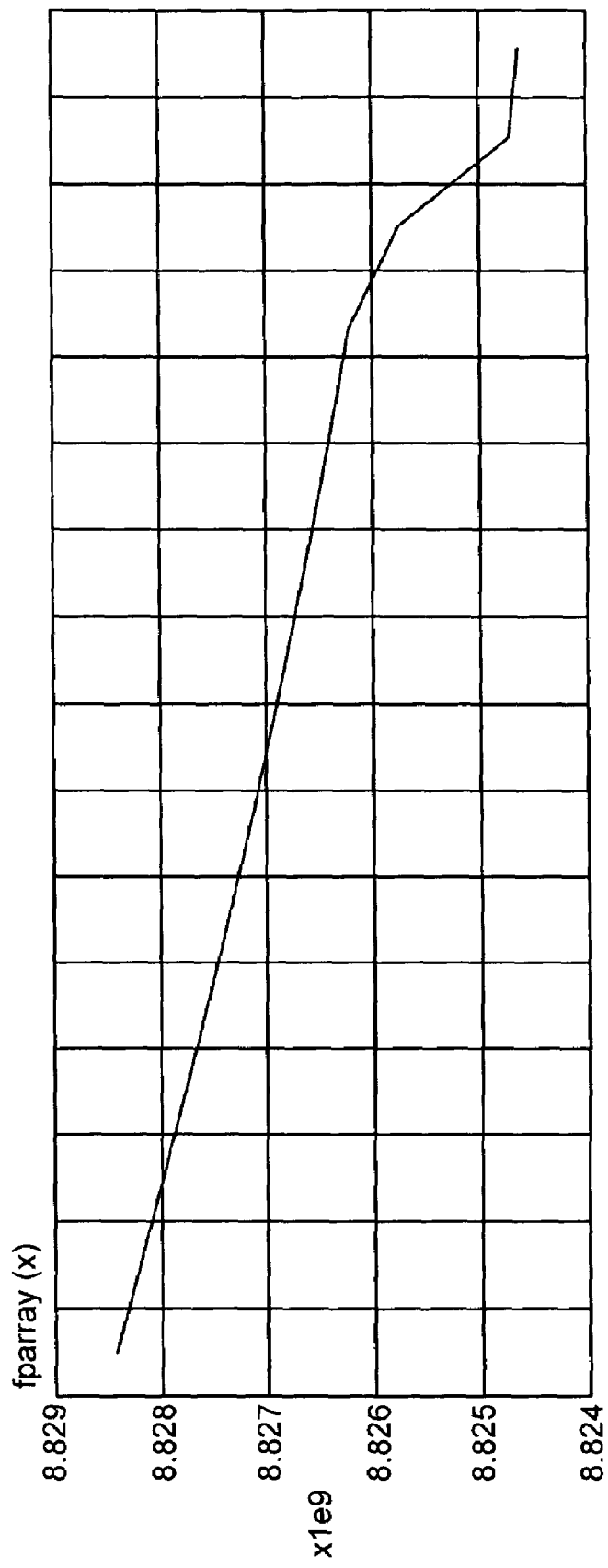
FIG. 18 shows simulated VCO frequency pushing in a Mode 2 varactor VCO circuit according to FIG. 15.
Figure 19:
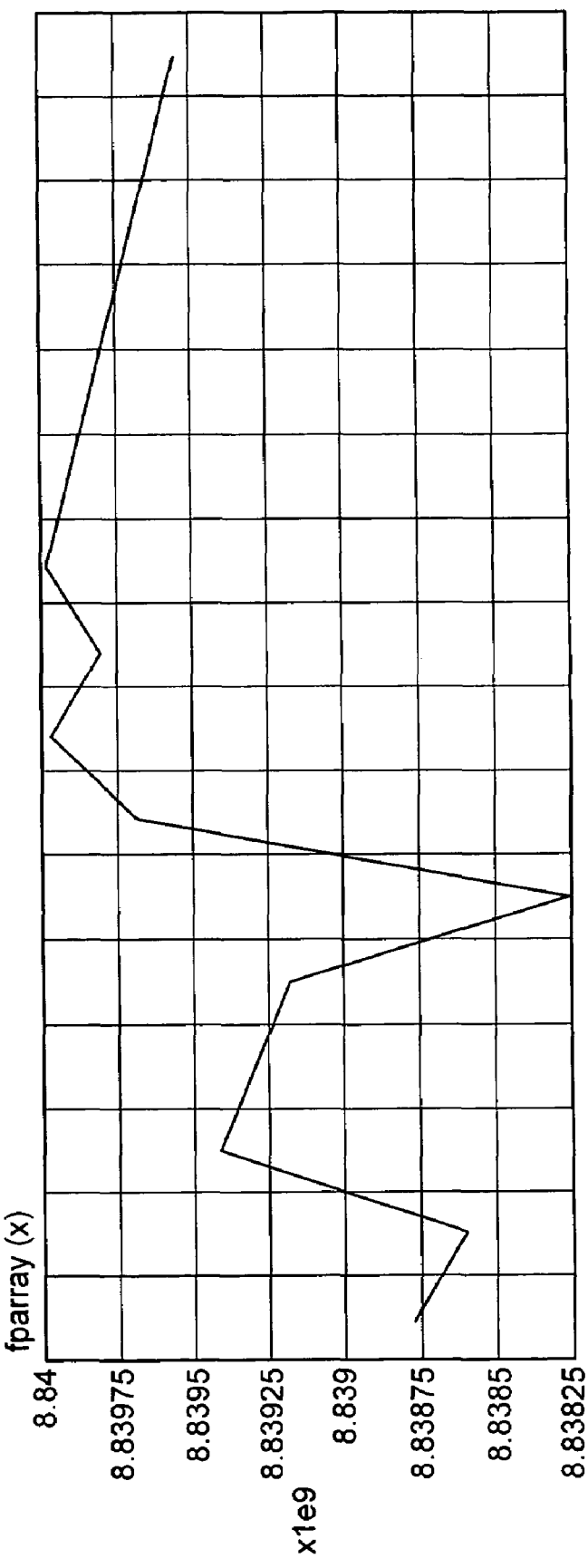
FIG. 19 shows simulated frequency pushing in a Mode 4a varactor VCO circuit according to claim 16.

Some benefits of embodiments of the invention can be seen when considering the supply pushing characteristics of VCOs constructed from mode 1 (I-MOS), mode 2 (D=S=BG) and mode 4a (embodiments of the invention, BG=CM, with $C_{filter}$) varactors. FIGS. 14, 15, and 16 show simplified schematics of the mode 1, 2 and 4a VCOs considered. The top curves of FIGS. 17, 18, and 19 show the simulated response of these VCOs to a sixteen equal step variation in $V_{DD}$ from 1.62 to 1.98V (+/−10% of 1.8V). The supply pushing is the change in frequency with supply voltage, which is 450 MHz/V for mode 1 VCO, −10.6 MHz/V for mode 2 VCO and less than 4.9 MHz/V for mode 4a VCO, where the precision of the simulation result is generating numerical noise that prevents an even lower result from being observed. From these results, a 42× to 92× improvement in supply pushing can be seen for modes 2 and 4a over mode 1. Also considering the tuning range performance of these varactor modes from the other simulations above, further suggests benefits of embodiments of the invention over other MOS varactor modes. This is summarized in Table 1 below, along with a figure of merit that is the calculated small signal varactor BW/VCO pushing.

TABLE 1

Small Signal Varactor BW and VCO Pushing Summary for Modes 1, 2, 4a MOS varactors and VCOs

| Varactor/VCO | Varactor Small Signal Tuning BW (MHz) | VCO Supply Pushing (MHz/V) | Small Signal Varactor BW/VCO Pushing FOM |
|---|---|---|---|
| mode 1 | 2690 | 450 | 6 |
| mode 2 | 1469 | 10.6 | 139 |
| mode 4a | 2519 | 4.9 | 514 |

Figure 20:
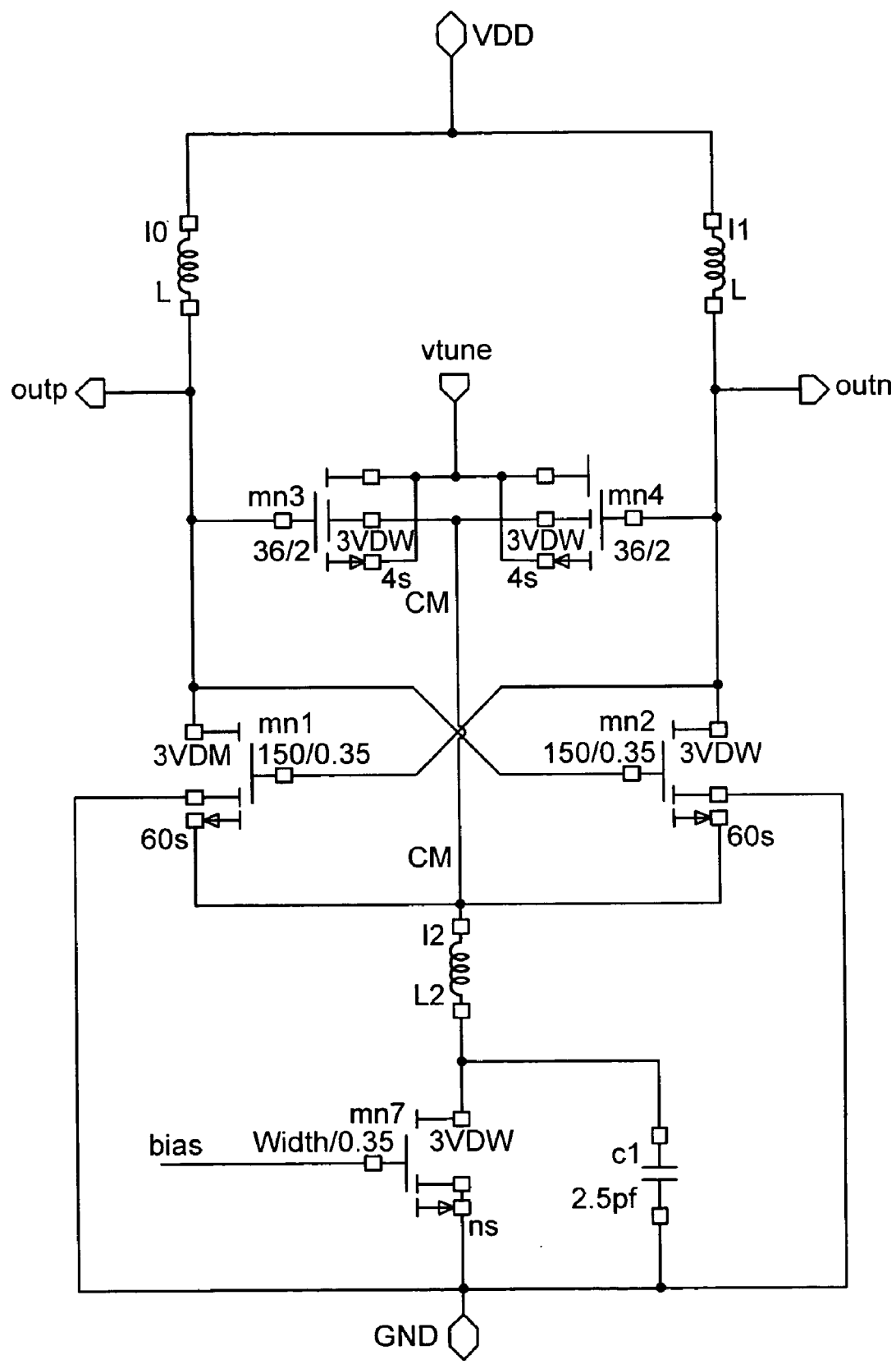
FIG. 20 shows a Mode 4a varactor VCO schematic with ground BG negative Gm devices.
Figure 21:
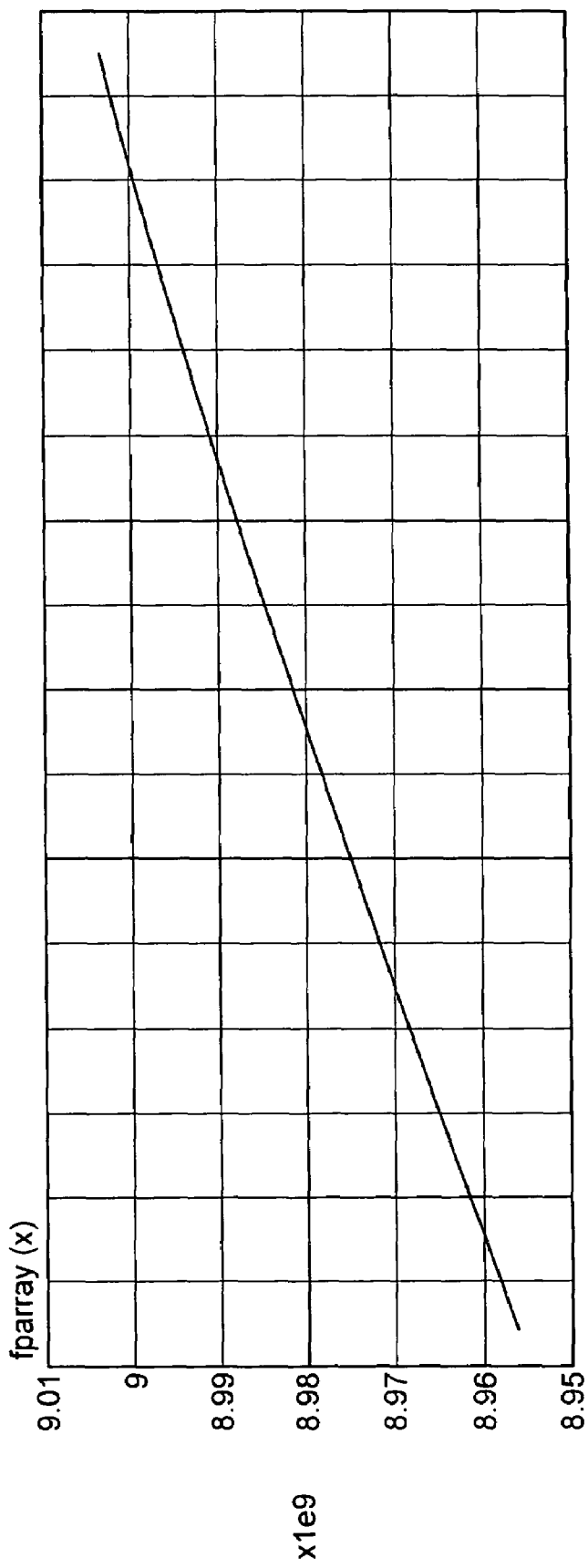
FIG. 21 shows simulated frequency pushing in a Mode 4a varactor VCO circuit according to FIG. 20.

In all of the VCOs discussed so far, the back gates of the negative transconductance devices are connected to their source terminals, except for those of the mode 1 VCO in FIG. 14, where all the back gates are connected to ground. The contribution of the transconductance (Gm) devices to the overall pushing response of mode 1 can be calculated by analyzing the VCO in FIG. 20, where the varactor is configured as in mode 4a, but the Gm back gates are connected to ground. FIG. 21 shows the simulated pushing response of this VCO, 133 MHz/V (or about ⅓ of the total mode 1 performance), indicating the importance of an appropriate negative Gm device BG connection for all of the Varactor modes.

VCO Frequency, BW Simulations vs Varactor Mode

The large signal simulations of FIGS. 14, 15, and 16 further shows evidence of the advantage of various embodiments. For a now fixed $V_{dd}$ supply, the $V_{tune}$ of each VCO is varied by 600 mV and the tank swing held large at 2.5V pk-pk differential. The difference in frequency for this $V_{tune}$ variation is the VCO large signal tuning bandwidth. Table 2 below summarizes three simulated varactor tuning bandwidths and the calculated large signal VCO BW/pushing figure of merit.

TABLE 2

Large Signal VCO BW and Supply Pushing Summary for Modes 1, 2, 4a VCOs

| VCO Varactor | VCO Large Signal Tuning BW (MHz) | VCO Supply Pushing (MHz/V) | Large Signal VCO BW/Pushing FOM |
|---|---|---|---|
| mode 1 | 718 | 450 | 1.6 |
| mode 2 | 358 | 10.6 | 34 |
| mode 4a | 605 | 4.9 | 123 |

Although various exemplary embodiments of the invention have been disclosed, it should be apparent to those skilled in the art that various changes and modifications can be made which will achieve some of the advantages of the invention without departing from the true scope of the invention.

What is claimed is:

1. A metal oxide semiconductor (MOS) varactor device comprising:
   a MOS varactor device having a source and a drain connected to each other, and a back gate, electrically separate from the source and drain, and connected to a circuit common mode point.

2. A varactor device according to claim 1, wherein the common mode point is referenced to a circuit supply voltage.

3. A varactor device according to claim 1, wherein the device is part of a voltage controlled oscillator (VCO).

4. A varactor device according to claim 1, wherein the device is part of an LC tank circuit.

5. A varactor device according to claim 1, wherein the device is an nMOS device.

6. A varactor device according to claim 1, wherein the device is a pMOS device.

7. A voltage controlled oscillator (VCO) comprising:
   a resonant tank circuit for creating a radio frequency (rf) output signal; and
   a metal oxide semiconductor (MOS) varactor for controlling the resonant frequency of the tank circuit, the varactor having a source and a drain connected to each other, and a back gate, electrically separate from the source and drain, and connected to a circuit common mode point.

8. A VCO according to claim 7, wherein the common mode point is referenced to a circuit supply voltage.

9. A VCO according to claim 7, wherein the device is part of a voltage controlled oscillator (VCO).

10. A VCO according to claim 7, wherein the device is part of an LC tank circuit.

11. A VCO according to claim 7, wherein the device is an nMOS device.

12. A VCO according to claim 7, wherein the device is a pMOS device.

* * * * *